(12) United States Patent
Padhi et al.

(10) Patent No.: US 7,802,538 B2
(45) Date of Patent: Sep. 28, 2010

(54) METHOD TO DEPOSIT FUNCTIONALLY GRADED DIELECTRIC FILMS VIA CHEMICAL VAPOR DEPOSITION USING VISCOUS PRECURSORS

(75) Inventors: Deenesh Padhi, Sunnyvale, CA (US); Sohyun Park, Santa Clara, CA (US); Ganesh Balasubramanian, Sunnyvale, CA (US); Juan Carlos Rocha-Alvarez, Sunnyvale, CA (US); Li-Qun Xia, Santa Clara, CA (US); Derek R. Witty, Fremont, CA (US); Hichem M'Saad, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 924 days.

(21) Appl. No.: 11/608,333

(22) Filed: Dec. 8, 2006

(65) Prior Publication Data

US 2007/0079753 A1    Apr. 12, 2007

Related U.S. Application Data

(62) Division of application No. 10/931,609, filed on Sep. 1, 2004, now Pat. No. 7,166,544.

(51) Int. Cl.
| C23C 16/00 | (2006.01) |
| C23C 16/30 | (2006.01) |
| C23C 16/455 | (2006.01) |
| C23C 16/52 | (2006.01) |

(52) U.S. Cl. ............... 118/697; 118/715; 118/696
(58) Field of Classification Search ........... 118/715, 118/696, 697
See application file for complete search history.

(56) References Cited

U.S. PATENT DOCUMENTS

| 5,781,693 | A | 7/1998 | Ballance et al. |
| 6,068,884 | A | 5/2000 | Rose et al. |
| 6,176,930 | B1 * | 1/2001 | Koai et al. ............ 118/715 |
| 6,436,193 | B1 | 8/2002 | Kasai et al. |
| 6,444,039 | B1 | 9/2002 | Nguyen |
| 6,464,782 | B1 * | 10/2002 | Sivaramakrishnam et al. ............ 117/202 |
| 6,486,082 | B1 | 11/2002 | Cho et al. |
| 6,498,112 | B1 | 12/2002 | Martin et al. |
| 6,570,256 | B2 * | 5/2003 | Conti et al. .......... 257/761 |
| 6,607,976 | B2 | 8/2003 | Chen et al. |

(Continued)

FOREIGN PATENT DOCUMENTS

EP    1126046 A    8/2001

*Primary Examiner*—Jeffrie R Lund
(74) *Attorney, Agent, or Firm*—Townsend and Townsend and Crew

(57) ABSTRACT

A method of forming a graded dielectric layer on an underlying layer including flowing a mixture of a silicon-carbon containing gas, an oxygen containing gas and a carrier gas through a showerhead comprising a blocking plate and a faceplate to form an oxide rich portion of the graded dielectric layer, where the silicon-carbon containing gas has an initial flow rate, flowing the silicon-carbon containing gas at a first intermediate flow rate for about 0.5 seconds or longer, where the first intermediate flow rate is higher than the initial flow rate, and flowing the silicon-carbon containing gas at a fastest flow rate higher than the first intermediate flow rate to form a carbon rich portion of the graded dielectric layer.

13 Claims, 7 Drawing Sheets

U.S. PATENT DOCUMENTS

| | | |
|---|---|---|
| 6,713,390 B2 | 3/2004 | M'Saad et al. |
| 6,740,539 B2 | 5/2004 | Conti et al. |
| 6,753,258 B1 | 6/2004 | Gaillard et al. |
| 6,958,526 B2 | 10/2005 | Gates et al. |
| 7,166,544 B2 | 1/2007 | Padhi et al. |
| 2002/0020767 A1 | 2/2002 | Pyo |
| 2003/0017642 A1 | 1/2003 | Conti et al. |
| 2003/0045098 A1* | 3/2003 | Verhaverbeke et al. ...... 438/689 |
| 2003/0101938 A1* | 6/2003 | Ronsse et al. ............... 118/726 |
| 2004/0067308 A1 | 4/2004 | Zheng et al. |
| 2004/0115954 A1 | 6/2004 | Todd |
| 2004/0121616 A1 | 6/2004 | Satta et al. |
| 2005/0191848 A1 | 9/2005 | Bencher |
| 2005/0202685 A1 | 9/2005 | Huang et al. |
| 2006/0046520 A1* | 3/2006 | Padhi et al. ................. 438/778 |
| 2007/0079753 A1* | 4/2007 | Padhi et al. ................. 117/102 |

* cited by examiner

METHOD TO DEPOSIT FUNCTIONALLY GRADED DIELECTRIC FILMS VIA CHEMICAL VAPOR DEPOSITION USING VISCOUS PRECURSORS

CROSS REFERENCE TO RELATED APPLICATION

This application is a divisional of U.S. patent application Ser. No. 10/931,609, entitled "METHOD TO DEPOSIT FUNCTIONALLY GRADED DIELECTRIC FILMS VIA CHEMICAL VAPOR DEPOSITION USING VISCOUS PRECURSORS," filed Sep. 1, 2004, the entire disclosure of which is incorporated herein by reference for all purposes.

BACKGROUND OF THE INVENTION

Conventional integrated circuit ("IC") device fabrication includes etching patterns of gaps into a metal layer such as aluminum. The gaps may then be filled with dielectric materials such as silicon dioxide. More recently, IC device fabricators are switching from aluminum to copper and other more conductive metals to take advantage of the lower resistance of these metals to electric current. In the case of copper, the metal's higher resistance to etching than aluminum is encouraging a switch to damascene processes where dielectric layers are deposited to form an integrated stack that are etched to create gaps for a subsequent metal gap-fill.

The dielectric layers that separate the layers of metal in a damascene structure are sometimes referred to as intermetal dielectric (IMD) layers. The capacitance (C) of the IMD material and the resistance (R) of the metal layers are significant components of the RC constant of the IC circuit. As the RC constant decreases, the circuit speed increases, and IMD layers having lower capacitance (i.e., lower dielectric constants "κ") complement the lower resistance of metals like copper.

IMD layers typically include a barrier layer to prevent the diffusion of the metal into the adjacent dielectric layers. One material used for the barrier layer is silicon nitride ($Si_xN_y$), which is also commonly used as an etch stop material for the formation of the damascene structures. Unfortunately, silicon nitride has a relatively high dielectric constant (κ=7.0 to 7.5 for $Si_3N_4$ compared to κ=4.0 to 4.2 for $SiO_2$), which increases the overall κ value of the dielectric layer.

More recently, barrier layers have been developed from materials with lower dielectric constants. Silicon-carbon based barrier layers (e.g., silicon oxycarbide (SiOCH) barrier layers) have been developed that have lower dielectric constants than silicon nitride. One such layer, for example, is the BLOK™ (Barrier Low K) developed by Applied Materials, Inc. of Santa Clara, Calif. These low-κ barrier layers may be deposited by, for example, plasma enhanced chemical vapor deposition using trimethylsilane (TMS).

While silicon oxycarbide and other silicon-carbon based low-κ barrier layers have improved dielectric constants, they often have poor adherence to other low-κ silicon-carbon materials that make up the bulk dielectric portion of the IMD layer. Oxide films such as silicon dioxide ($SiO_2$) adhere much better to the silicon-carbon based low-κ barrier layers, but also have higher κ values that raise the overall dielectric constant of the IMD layer. Thus, there is a need for methods of forming low-κ IMD layers that have good adhesion between the barrier layer and the bulk dielectric portion of the layer.

BRIEF SUMMARY OF THE INVENTION

Embodiments of the present invention include a method of forming a graded dielectric layer on an underlying layer. The method includes the step of flowing a mixture of a silicon-carbon containing gas, an oxygen containing gas and a carrier gas through a showerhead comprising a blocking plate and a faceplate to form an oxide rich portion of the graded dielectric layer, where the silicon-carbon containing gas has an initial flow rate. The method also includes the step of flowing the silicon-carbon containing gas at a first intermediate flow rate for about 0.5 seconds or longer, where the first intermediate flow rate is higher than the initial flow rate. The method may also include the step of flowing the silicon-carbon containing gas at a fastest flow rate higher than the first intermediate flow rate to form a carbon rich portion of the graded dielectric layer.

Other embodiments of the invention include a method of forming a graded dielectric layer on an underlying layer, where the method includes the step of flowing a mixture of a silicon-carbon containing gas, an oxygen containing gas and a carrier gas through a showerhead comprising a blocking plate and a faceplate to form an oxide rich portion of the graded dielectric layer, wherein the silicon-carbon containing gas has an initial flow rate. The method also includes the step of increasing the silicon-carbon containing gas to a fastest flow rate to form a carbon rich portion of the graded dielectric layer, where the carrier gas has a carrier gas flow rate that stays constant until after the silicon-carbon containing gas reaches the fastest flow rate.

Additional embodiments of the invention include a system for forming a graded dielectric layer on an underlying layer. The system includes a showerhead that includes a blocking plate and a face plate, wherein the showerhead is coupled to a gas supply inlet through which a process gas comprising a silicon-carbon containing gas, an oxygen containing gas and a carrier gas is introduced into the showerhead. The system also includes a liquid flow meter to control a flow rate of the silicon-carbon containing gas to the showerhead, where the liquid flow meter is programmed to flow the silicon-carbon containing gas at an initial flow rate during the formation of an oxygen rich portion of the graded dielectric layer, then increasing the silicon-carbon containing gas flow rate from the initial flow rate to an intermediate flow rate, and maintaining the intermediate flow rate for about 0.5 seconds or longer, and then further increasing the silicon-carbon containing gas flow rate from the intermediate flow rate to a fastest flow rate to form a carbon rich portion of the graded dielectric layer.

Additional features are set forth in part in the description that follows, and in part will become apparent to those skilled in the art upon examination of the following specification or may be learned by the practice of the invention. The features and advantages of the invention may be realized and attained by means of the instrumentalities, combinations, and methods particularly pointed out in the appended claims.

DETAILED DESCRIPTION OF THE INVENTION

Figure 1A:
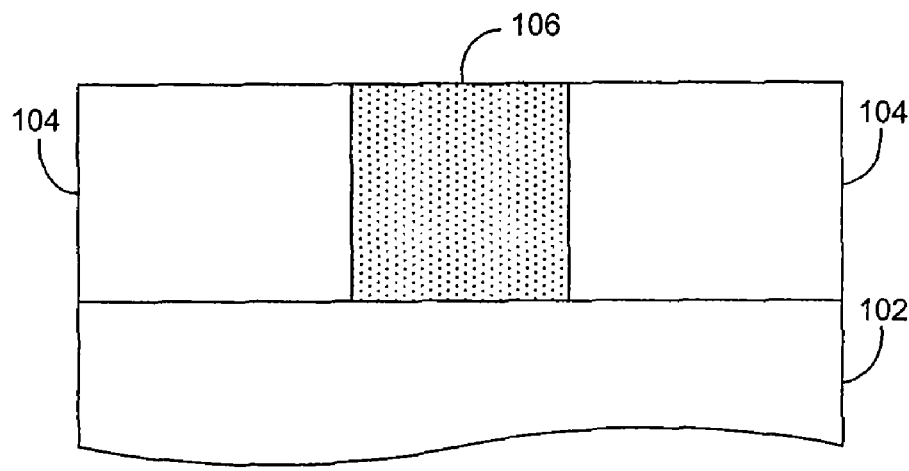
FIGS. 1A and 1B show a barrier layer and functionally graded dielectric layer formed on a metal filled trench according to embodiments of the methods of the present invention.

Embodiments of the present invention include methods of forming a low-κ, functionally graded film layer that includes an oxide rich portion for better adherence to an underlying layer (e.g., a silicon oxycarbide barrier layer) and a carbon-rich portion (e.g., the bulk dielectric) having a lower κ value. The method includes flowing a mixture of silicon-carbon containing gas and oxygen containing gas at an initial flow rate favoring a high oxygen to silicon flow rate ratio to deposit a thin (e.g., about 10 Å to about 80 Å thick) oxide rich portion of the functionally graded dielectric layer. Afterwards, flow rate for the silicon-carbon containing gas may be increased (and oxygen containing gas may be decreased) to boost the silicon-carbon concentration in the bulk dielectric portion of the functionally graded dielectric layer. Because the oxide-rich portion is relatively small, it has a small effect on the overall κ value of the layer.

The silicon-carbon gases used with the present invention are often organo-silicon compounds such as octamethylcyclotetrasiloxane ("OMCTS") [((CH$_3$)$_2$SiO)$_4$]. Compounds like OMCTS are viscous liquids at room temperature, which when heated (e.g., about 350° C.) produce vapors that may be carried by a carrier gas to a deposition chamber where the functionally graded dielectric is formed.

The viscous liquid phase characteristics of these organo-silicon compounds at room temperature create challenges for delivering a uniform distribution of their vapors through a gas showerhead and into the deposition chamber. The inertia effects of the vapors favor their being more concentrated near the center of the showerhead and less concentrated at towards edges. As a consequence, a blocker plate (also known as a baffle) may be inserted between the showerhead gas supply inlet and faceplate to distribute more evenly the silicon-carbon vapors that pass through the faceplate into the deposition chamber.

The blocker plate, however, can also introduce a drop in the pressure of the gas mixture across the plate, which can result in condensation of the silicon-carbon around passages through the blocker plate and face plate. The condensate in these passages, as well as the formation of organo-silicon aerosol particles in the reaction chamber, can lead to increased numbers of infilm adders (e.g., about 10,000 or more adders) falling on the substrate. The problem is exacerbated by the fact that the adders are not uniformly distributed on the substrate, but instead tend to concentrate in the area below the center of the showerhead faceplate.

Embodiments of the present invention reduce condensation of the silicon-carbon vapor and the infilm adders through a number of techniques, including modulating the change in the flow rate of the silicon-carbon containing gas, and maintaining a high carrier gas flow rate until after an increase in the flow rate of the silicon-carbon containing gas has occurred. These techniques and others, used alone or in combination, can reduce the number of infilm adders from the tens of thousands to the order of about 10 or less. Before describing embodiments of the techniques in more detail, a description of some simplified IC structures that include the functionally graded dielectric layers is presented.

Exemplary Integrated Circuit Structures

FIG. 1A shows an example of a layers upon which a barrier layer and a functionally graded dielectric layer formed according to embodiments of the present invention. The layers include a dielectric layer 104 containing trench 106 filled with a conductive material (e.g., copper). The dielectric layer 104 and trench 106 may be formed on an underlying support layer 102. Support layer 102 may be a silicon substrate, a metal film layer (e.g. a copper or aluminum layer), a salicide layer formed on top of a source, drain or gate electrode, or a dielectric layer (e.g., a IMD layer), among other kinds of layers.

Figure 1B:
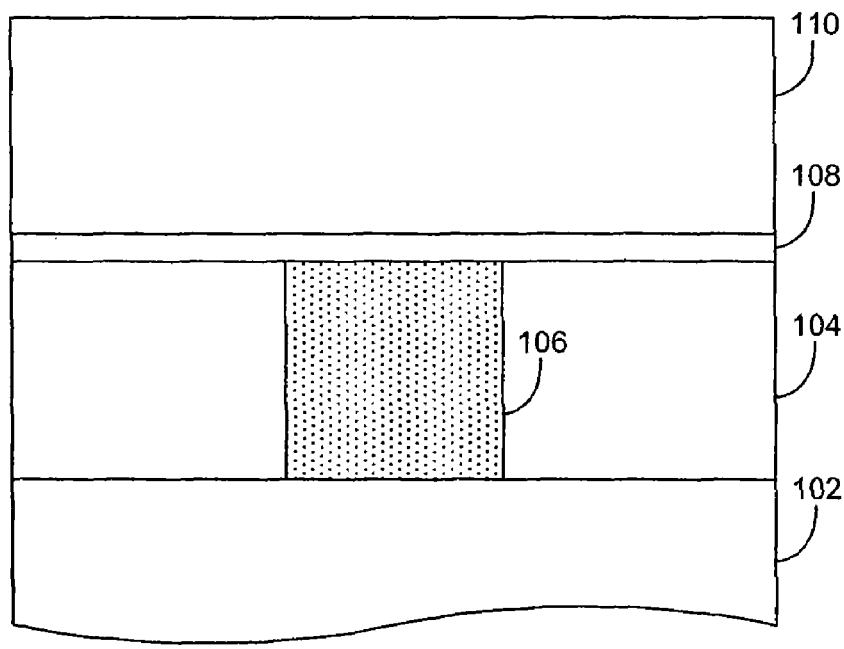

Referring to FIG. 1B, a barrier layer 108 and functionally graded dielectric layer 110 is shown formed on the underlying layer of FIG. 1A. Barrier layer 108 may be formed from silicon-carbon based materials (e.g., silicon oxycarbide) that have lower κ values than conventional oxide and nitride based barrier layers (e.g., silicon nitride). The κ value of barrier layer 108 formed from silicon-carbon based materials depends on the ratio of carbon to silicon atoms in the layer.

A barrier layer 108 having an atomic ratio of carbon to silicon (C:Si ratio) from about 55:45 to about 65:35 normally provides a layer with low κ characteristics. If the C:Si ratio in the layer is too low, the dielectric constant may be too large (e.g., κ=7.0 for a C:Si ratio of about 50:50). In addition, the leakage current of the layer tends to increase as the C:Si ratio in the layer decreases. The C:Si atomic ratio in the layer depends in turn on the C:Si atomic ratio of the gaseous mixture used to form the layer.

Generally, the C:Si ratio in the gaseous mixture is greater than 1:1 (e.g., about 3:1 to about 8:1). For a given C:Si ratio in the gaseous mixture, the higher the substrate temperature the lower the C:Si ratio in the deposited layer. Relatively high C:Si ratios in the gaseous mixture may be desirable when depositing the barrier layer 108 at high substrate temperatures. Details of the deposition of exemplary barrier layers upon which a functionally graded dielectric layer may be formed according to methods of the invention are described in commonly assigned U.S. Pat. No. 6,713,390, filed on Jul. 12, 2002, entitled "BARRIER LAYER DEPOSITION USING HDP-CVD," the entire contents of which are herein incorporated by this reference.

Functionally graded dielectric ("FGD") layer 110 may be formed on the underlying barrier layer 108 according to embodiments of the methods of the invention described below. The FGD layer 110 may include an oxide-rich portion that is in contact with the underlying barrier layer 108, and a carbon-rich portion (i.e., the bulk dielectric portion) that is further away from barrier layer 108. The oxide-rich portion of the layer may comprise silicon (Si), oxygen (O) and carbon (C) where the ratio of silicon to oxygen is lower than average to reflect the higher than average concentration of oxygen present in the layer. The oxide-rich portion of the FGD layer 110 may be in a range from about 10 Å to about 100 Å thick (e.g., about 70 Å to 80 Å thick).

The carbon-rich, bulk dielectric portion of FGD layer 110 may have a C:Si ratio substantially similar to barrier layer 108 (e.g., about 55:45 to about 65:35). The bulk dielectric portion may be from about 5000 Å to about 10,000 Å thick, and provide FGD layer with an overall κ value of about 3.5 or less (e.g., from about 3.3 to about 3.0).

Figure 2:
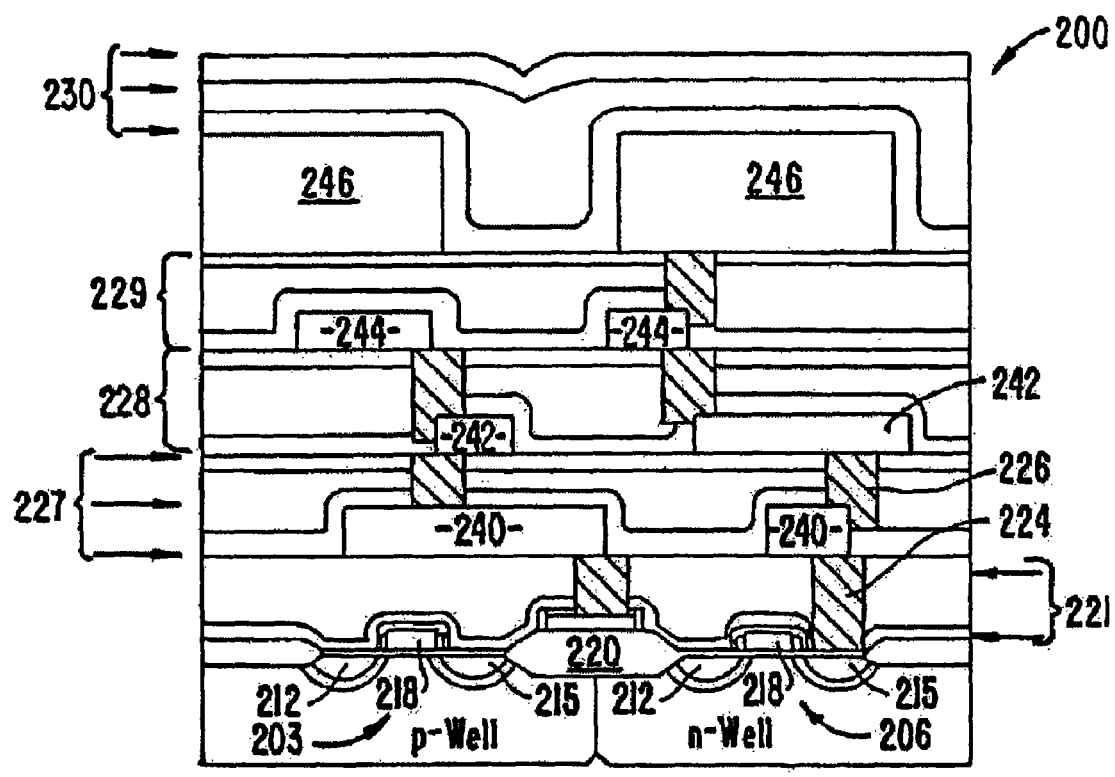
FIG. 2 shows a simplified cross-sectional view of an integrated circuit device that includes functionally graded dielectric layer formed according to embodiments of the methods of the present invention.

FIG. 2 illustrates a simplified cross-sectional view of an integrated circuit 200 that includes functionally graded intermetal dielectric (FGIMD) layers 240, 242, 244 formed according to embodiments of the present invention. Integrated circuit 200 includes NMOS and PMOS transistors 203 and 206, which are separated and electrically isolated from each other by a field oxide region 220 formed by local oxidation of silicon (LOCOS), or other technique. Alternatively, transistors 203 and 206 may be separated and electrically isolated from each other by a shallow trench isolation (STI) technique (not shown) when transistors 203 and 206 are both NMOS or both PMOS. Each transistor 203 and 206 comprises a source region 212, a drain region 215 and a gate region 218.

A premetal dielectric (PMD) layer 221 separates transistors 203 and 206 from metal layer 240 with connections between metal layer 240 and the transistors made by contacts 224. Metal layer 240 is one of four metal layers, 240, 242, 244 and 246, included in integrated circuit 200. Each metal layer 240, 242, 244, and 246 is separated from adjacent metal layers by respective barrier layers and FGIMD layers 227, 228, or 229. Adjacent metal layers are connected at selected openings by vias 226. Deposited over metal layer 246 are planarized passivation layers 230.

It should be understood that simplified integrated circuit 200 is for illustrative purposes. One of ordinary skill in the art could implement use of the present invention in relation to fabrication of other integrated circuits such as microprocessors, application specific integrated circuits (ASICs), memory devices, and the like. Further, the present invention may be applied to PMOS, NMOS, CMOS, bipolar, or BiCMOS, among other devices.

Exemplary Methods of Forming Graded Dielectric

Figure 3:
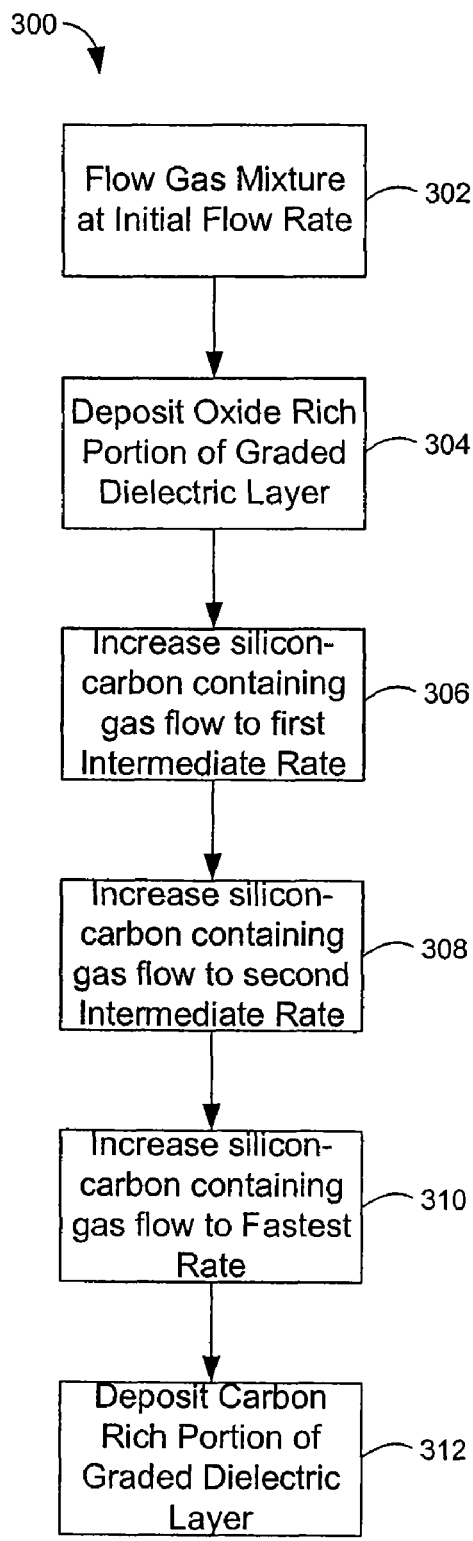
FIG. 3 shows a flowchart of steps for forming a graded dielectric layer according to embodiments of the methods of the present invention.

Referring to FIG. 3, a flowchart is shown illustrating the step of a method of forming a graded dielectric layer according to embodiments of the invention. The method may start by flowing a gas mixture at an initial flow rate 302 through a gas showerhead to deposit an oxide-rich portion of the graded dielectric layer 304 on an underlying layer (e.g., a low-κ barrier layer). The gas mixture may include a silicon-carbon containing gas (e.g., OMCTS), an oxygen containing gas (e.g., $O_2$) and a carrier gas (e.g., He).

The silicon containing gas may be a viscous liquid at room temperature and the flow rate of its gas vapors measured in milligrams per minute (mgm). When the silicon-carbon containing gas is OMCTS, its initial flow rate may be for example, 500 mgm in a He carrier gas flowing at a rate of about 4800 sccm and $O_2$ flowing at about 500 sccm during the deposition of the oxide-rich portion of the graded dielectric layer.

When the oxide-rich portion of the graded dielectric layer is formed, the relative amounts of the gas mixture components are changed to form portions of the dielectric layer with a higher carbon to silicon ratio (i.e., carbon-rich portions of the graded dielectric layer). These changes may include increasing the flow of the carbon-silicon gas to a first intermediate rate (e.g., increasing the flow rate of OMCTS from about 500 mgm to about 1000 mgm) and maintaining that rate for about 0.5 seconds or longer (e.g., from about 0.5 seconds to about 2.5 seconds).

Breaking up the increase in flow rate of viscous silicon-carbon precursors like OMCTS into one or more intermediate steps, reduces the chances of the precursor condensing in the passages of the showerhead, and/or forming aerosol droplets that deposit on the underlying layer. In the embodiment illustrated in FIG. 3, the silicon-carbon containing gas is increased to a second intermediate flow rate 308 (e.g., from about 1000 mgm to about 1750 mgm) for 0.5 seconds or longer before increasing to a final, fastest flow rate. Other embodiments have the silicon-carbon gas flow rate stop for a period of time at additional intermediate flow rates (not shown) before reaching the fastest flow rate.

While the flow rate of the carbon-silicon gas increases in a modulated fashion, the flow rates for the oxygen containing gas and/or carrier gas may be continuously decreasing. For example, as an OMCTS flow rate increases from about 500 mgm to about 1000 mgm, the $O_2$ flow rate may drop from about 500 sccm to about 160 sccm and the He gas flow rate may drop from about 4800 sccm to about 1000 sccm. The flow rates for one or more of the gases other than the silicon-carbon gas may decrease continuously from an initial flow rate to a final flow rate without stopping at any intermediate steps. For example, following the deposition of the oxide-rich layer, the flow rate for these gases may drop at a constant and continuous rate (without having an intermediate rate plateau) until reaching a final flow rate for the rest of the deposition.

After the silicon-carbon gas has moved through intermediate flow rates 306 and 308, it increases to a final, fastest flow rate 310. For example, an OMCTS flow rate may increase from the second intermediate rate (e.g., about 1750 mgm) to a fastest flow rate (e.g., about 2500 mgm) where the fastest flow rate may be maintained for 45 seconds or longer during the deposition of the carbon-rich portion of the graded dielectric layer 312.

Figure 4:
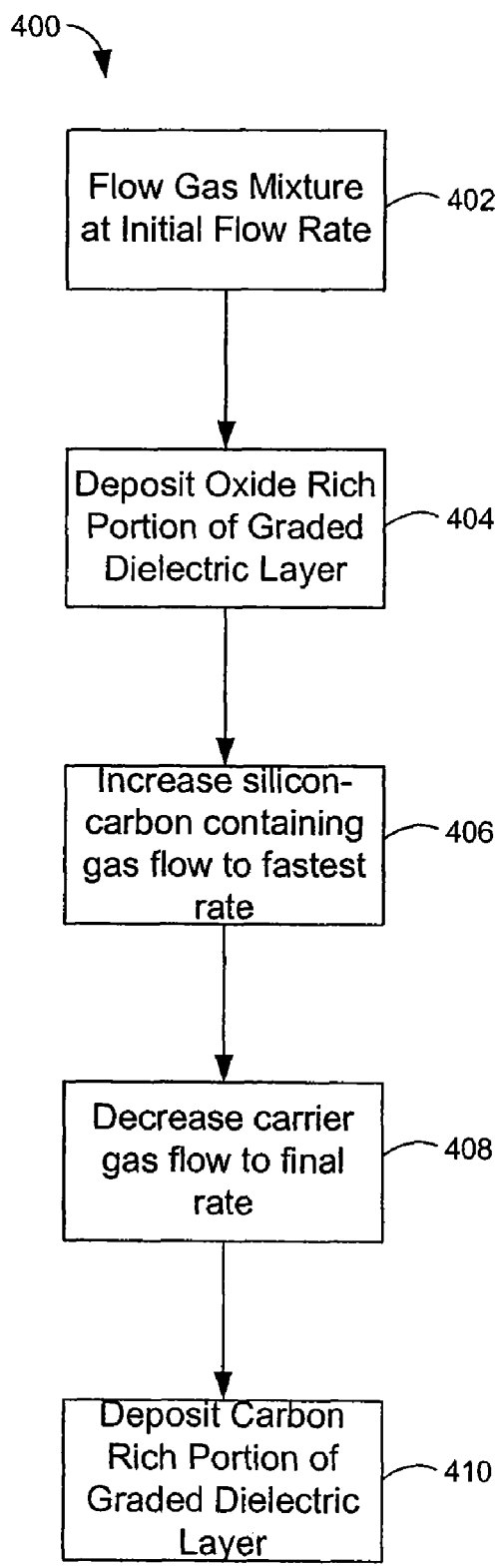
FIG. 4 shows a flowchart of steps for forming a graded dielectric layer according to additional embodiments of the methods of the present invention.

FIG. 4 shows a flowchart illustrating other embodiments for forming a graded dielectric layer according to methods of the invention. In these embodiments, the flow rate of the silicon-carbon containing gas increases continuously from an initial rate to a final, fastest rate without pausing at an intermediate step. Condensation and/or aerosolization of the silicon-carbon containing gas is avoided, however, by maintaining the flow rate of the carrier gas at a high initial rate until after the silicon-carbon containing gas is close to (or reaches) its fastest flow rate.

Similar to the embodiments described above, the method may start by flowing a gas mixture at an initial flow rate 402 through a gas showerhead to deposit an oxide-rich portion of the graded dielectric layer 404 on an underlying layer (e.g., a low-κ barrier layer). The gas mixture may include a silicon-carbon containing gas (e.g., OMCTS), an oxygen containing gas (e.g., $O_2$) and a carrier gas (e.g., He).

After the oxide-rich portion of the layer is formed, the silicon carbon containing gas is increased in step 406 from the initial flow rate (e.g., about 500 mgm) to a fastest flow rate (e.g., about 2500 mgm) without pausing at an intermediate flow rate. The increase in the silicon-carbon containing gas flow rate may be, for example, about 1350 mgm/sec, such that the flow rate continuously increases from the initial flow rate to the final flow rate in about 1.5 seconds.

Once the silicon-carbon containing gas approaches (e.g., within about 500 mgm of fastest rate) or reaches the fastest flow rate, the flow rate of the carrier gas may be reduced to a final flow rate 408 for the deposition of the carbon-rich portion of the graded dielectric layer 410. For example, a carrier gas that includes helium (He) may maintain an initial He flow rate of about 4800 sccms while the OMCTS flow rate increases from about 500 mgm to about 2500 mgm. When the OMCTS flow rate approaches (e.g., about 2000 mgm) or reaches (e.g., about 2500 mgm) its fastest flow rate the He flow rate drops from the initial carrier gas flow rate to a final flow rate (e.g., about 1000 sccm).

In some embodiments, the oxygen containing gas may drop while the silicon-carbon containing gas is increasing to its fastest flow rate. In other embodiments, the oxygen containing gas may maintain its initial flow rate with the carrier gas until the silicon-containing gas approaches or reaches its fastest flow rate. For example, the flow rate for $O_2$ may decrease from about 500 sccm to about 160 sccm while the flow rate for OMCTS increases from 500 mgm to 2500 mgm.

Figure 5:
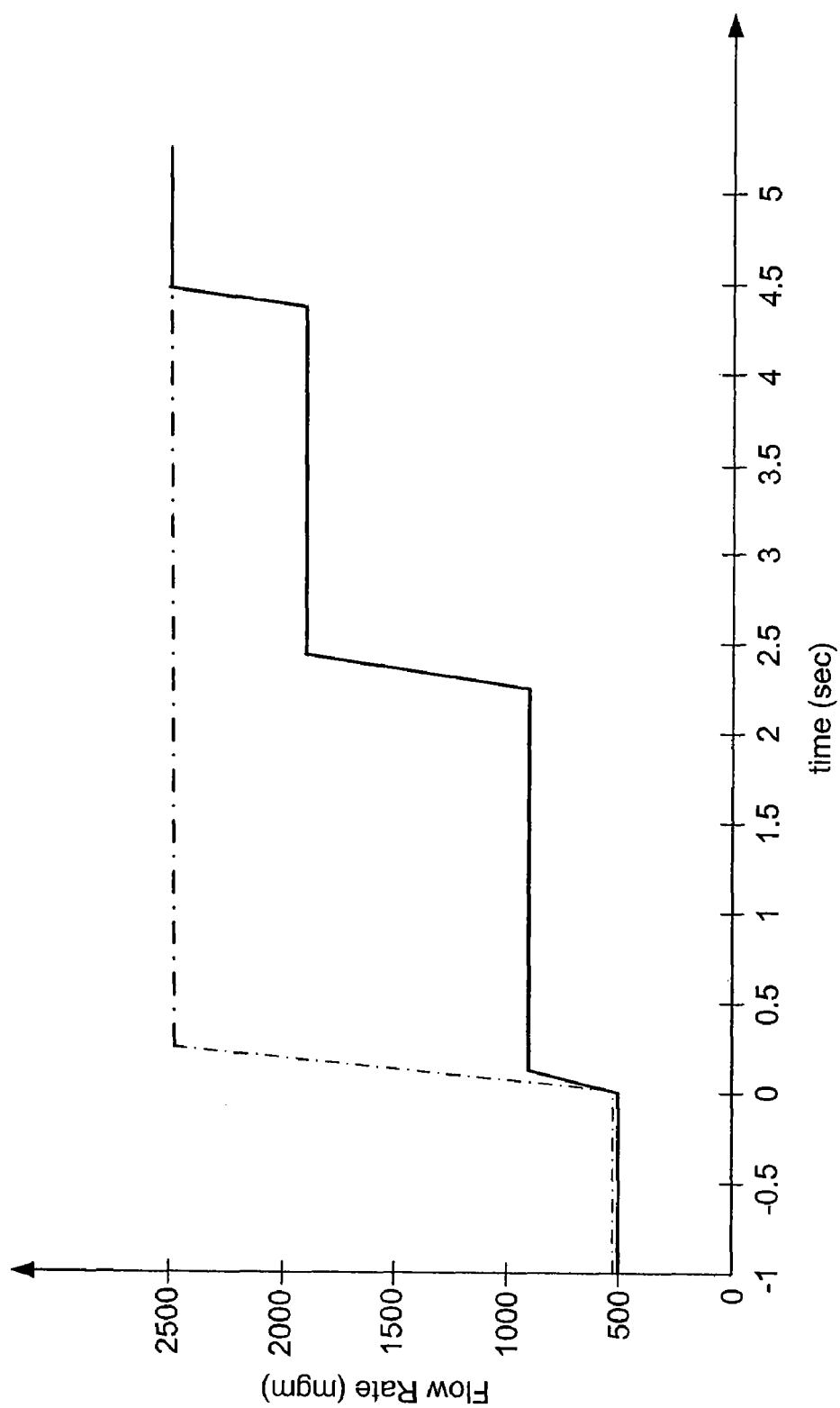
FIG. 5 plots the flow rate of a silicon-carbon containing gas as a function of time for a conventional dielectric layer deposition and a deposition according to an embodiment of the methods of the present invention.

FIG. 5 plots the flow rate of a silicon-containing gas over the course of a dielectric deposition using a conventional method (dashed line) and a method according to an embodiment of the invention (solid line). The conventional method increases the flow rate of the silicon-carbon gas from an initial rate of 500 mgm to a fastest flow rate of 2500 mgm in as short a time as possible (e.g., about 0.2 seconds). While the silicon-carbon gas is increasing, the carrier gas (not shown) is rapidly decreasing, and there is a high probability of forming a lot (e.g., about 1000 or more) of infilm adders on the underlying layers (e.g., the barrier layer).

In contrast, the plot of the increase in flow rate for the silicon-carbon containing gas according to the present invention (solid line) shows the gas going through two intermediate flow rate plateaus, with each plateau lasting about 2 seconds. As noted above, the intermediate steps reduce the chances of the precursor condensing in the passages of the showerhead, and/or forming aerosol droplets that deposit on the underlying layer.

Exemplary Showerhead & Deposition System

Figure 6:
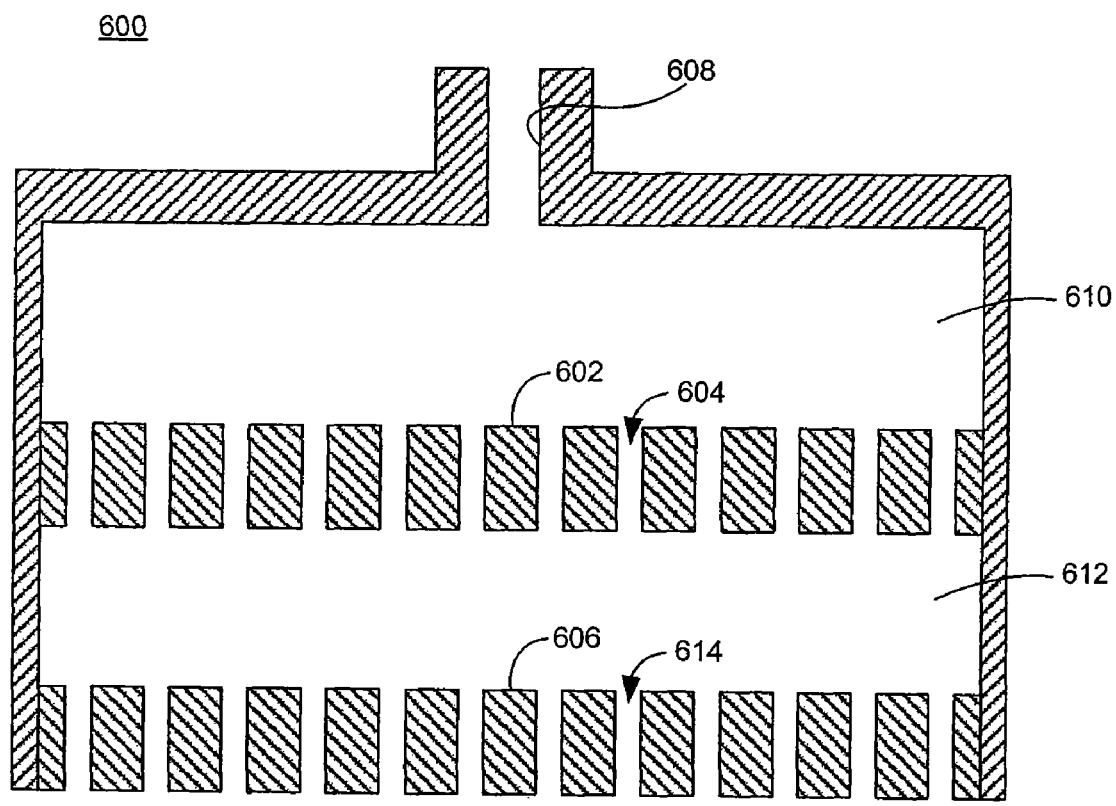
FIG. 6 shows a sectional view of a showerhead that may be used with embodiments of the present invention.

FIG. 6 illustrates a sectional view of the structure a showerhead 600 that may be used with embodiments of the present invention. A blocker plate 602 having a plurality of through-holes 604 is disposed between a face plate 606 of a shower head 600 and a connecting portion of a gas supply inlet 608. With the blocker plate 602, gas delivered from the gas supply inlet 608 is temporarily stored in a baffle space 610 on the upstream side of the blocker plate 602.

Thus, the irregularity of dynamic pressure of the gas delivered from the gas supply inlet 608 decreases. Consequently, the flow amount of the gas that flows in the through-holes 604 becomes almost equal. The resultant gas is supplied to a shower pre-chamber 612 on the downstream side of the blocker plate 602.

Thus, the irregularity of the pressure in the shower pre-chamber 612 decreases. Consequently, the flow amount of the gas sprayed from the face plate 606 through the face plate through-holes 614 becomes constant. The gas is uniformly supplied to the entire surface of an underlying substrate (not shown).

To cause the flow amount of the gas that flows in the through-holes 604 to be equal, it is effective to decrease the hole diameters of the through-holes 604 so as to increase the flow pressure loss of the through-holes 604. When the hole diameters of the through-holes 604 are decreased, the pressure in the baffle space 610 rises and thereby the irregularity of the pressure due to the dynamic pressure of the gas decreases. In addition, since the difference between the pressure of the upper portion and the pressure of the lower portion (i.e., the pressure in the baffle space 610 and the pressure in the shower pre-chamber 612) of the blocker plate 602 becomes large. Thus, the pressure at each position of the blocker plate 602 becomes almost equal. As a result, the flow amount of the gas that flows in the through-holes 604 becomes almost equal.

As noted above, rapid increases in the flow rate of viscous precursors such as OMCTS can result in condensation of the gas vapors in through-holes 604 and/or face plate through-holes 614, which in turn can create infilm adders on the underlying substrate. In addition, vapors starting to condense as they exit the showerhead 600 may act as nucleation sites that form aerosol particles that fall onto the substrate, creating another source of infilm adders.

Figure 7:
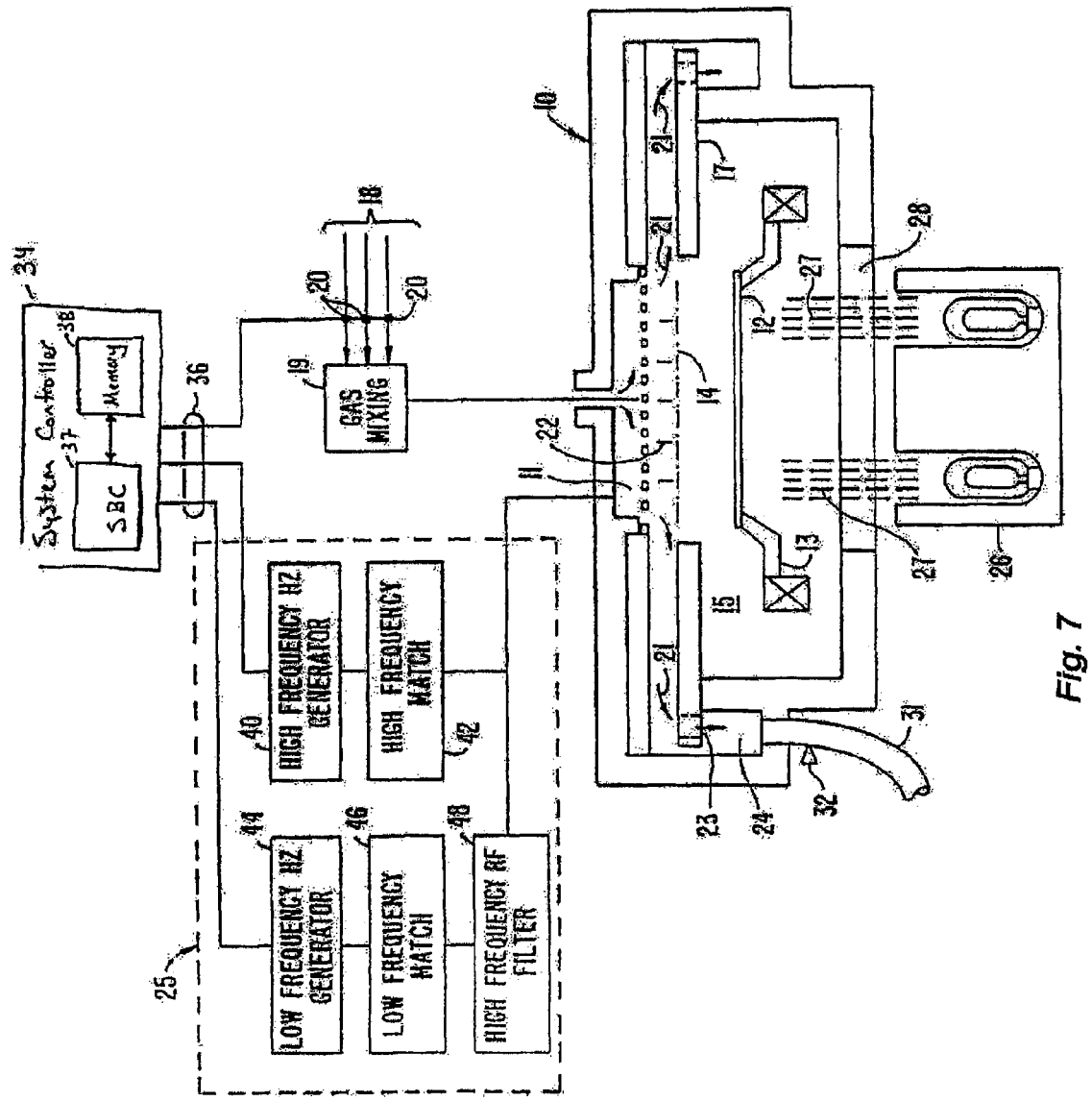
FIG. 7 shows a simplified cross-sectional diagram of an exemplary plasma CVD deposition chamber used with embodiments of the systems and methods of the present invention.

FIG. 7 illustrates an embodiment of a parallel-plate plasma enhanced chemical vapor deposition (PECVD) system 10 that may be used in conjunction with embodiments of the methods and systems of the present invention. System 10 includes a vacuum chamber 15 in which one or more layers may be deposited on a substrate (not shown). System 10 contains a gas distribution showerhead 11 for dispersing process gases through perforated holes in the face plate of showerhead 11 to a substrate (e.g., a 200 mm wafer, 300 mm wafer, etc.) positioned on susceptor 12. Susceptor 12 is thermally responsive and is mounted on supports 13 such that the susceptor 12 (and the substrate) can be controllably moved between a lower loading/off-loading position and an upper processing position 14, which is in proximity to showerhead 11. A center board (not shown) includes sensors for providing information on the position of the substrate.

When susceptor 12 and substrate are in processing position 14, they are surrounded by baffle plate 17 having a plurality of spaced holes 23 which exhaust into an annular vacuum manifold 24. Deposition and carrier gases are supplied through supply lines 18 into a mixing system 19 where they are combined and then sent to showerhead 11. Supply lines 18 for each of the process gases may include (i) safety shut-off valves (not shown) that can be used to automatically or manually shut-off the flow of process gas into the chamber, and (ii) mass flow controllers 20 that measure the flow of gas or liquid through the supply lines. When toxic gases are used in the process, the several safety shut-off valves are positioned on each gas supply line in conventional configurations.

The rate at which deposition and carrier gases are supplied to gas mixing system 19 is controlled by liquid or gas mass flow controllers 20 and/or by valves. During processing, gas supplied to showerhead 11 is vented toward and uniformly distributed radially across the surface of the wafer in a laminar flow as indicated by arrows 21. An exhaust system then exhausts the gas via ports 23 into the circular vacuum manifold 24 and out an exhaust line 31 by a vacuum pump system (not shown). The rate at which gases are released through exhaust line 31 is controlled by a throttle valve 32.

When performing a plasma enhanced process in system 10, a controlled plasma may be formed adjacent to the substrate by RF energy applied to showerhead 11 from RF power supply 25. Showerhead 11 may also act as an RF electrode, while susceptor 12 is grounded. RF power supply 25 may supply single or mixed frequency RF power (or other desired variations) to showerhead 11 to enhance the decomposition of reactive species introduced into chamber 15. The mixed frequency RF power is generated by a high frequency RF generator 40 (RF1) and corresponding match circuit 42 and a low frequency RF generator 44 (RF2) and corresponding match circuit 46. A high frequency filter 48 prevents voltage generated by high frequency generator 40 from damaging the low frequency generator.

Heat is distributed by an external lamp module 26. External lamp heater module 26 provides a collimated annular pattern of light 27 through a quartz window 28 onto an annular outer peripheral portion of susceptor 12. Such heat distribution compensates for the natural heat loss pattern of susceptor 12 and provides rapid thermal and uniform susceptor and substrate heating for effecting deposition.

The chamber lining, showerhead face plate, supports 13, and other system hardware may be made out of materials such as aluminum or anodized aluminum. An example of such an apparatus is described in U.S. Pat. No. 5,000,113 entitled "Thermal CVD/PECVD Reactor and Use for Thermal Chemical Vapor Deposition of Silicon Dioxide and In situ Multi-step Planarized Process," issued to Wang et al, assigned to Applied Materials, Inc., the assignee of the present invention, the entire contents of which is herein incorporated by reference.

A motor (not shown) raises and lower susceptor 12 between a processing position 14 and a lower, substrate-loading position. Motors and optical sensors are used to move and determine the position of movable mechanical assemblies such as throttle valve 32 and susceptor 12. The heater, motors, valves and flow controllers 20 connected to supply lines 18, gas delivery system, throttle valve 32, RF power supply 25, and lamp magnet drivers are all controlled by a system controller 34 over control lines 36, some of which are shown in FIG. 7.

System controller 34 controls activities of the apparatus. The system controller executes system control software, which is a computer program stored in a computer-readable medium such as a memory 38. Preferably, memory 38 may be a hard disk drive, but memory 38 may also be other kinds of memory. The computer program includes sets of instructions that dictate, for example, the timing, mixture of gases, chamber pressure, chamber temperature, RF power levels, susceptor position, and other parameters of a process. Other computer programs (e.g., one stored on another memory device such as a floppy disk or other program storage media) may also be used to operate processor 34.

The system controller may include a hard disk drive (memory 38), floppy disk drive and card rack, among other elements. The card rack contains a single board computer (SBC) processor 37, analog and digital input/output boards, interface boards and stepper motor controller boards. Various parts of system 10 may conform to the Versa Modular European (VME) standard that defies board, card cage, and connector dimensions and types. The VME standard also defines the bus structure having a 16-bit data bus and 24-bit address bus.

Experimental Examples

Experimental examples have shown that methods of the invention for forming a graded dielectric layer reduce the number of infilm adders deposited on an underlying barrier layer. Process conditions for a comparative example of forming a dielectric layer using a conventional deposition technique are listed in Table 1-A:

TABLE 1-A

Process Conditions for Conventional Dielectric Layer Deposition

| Process Parameter | Initiation | Deposition |
|---|---|---|
| Time Period (sec) | 1.5 | 43 |
| Heater Temp (° C.) | 350 | 350 |
| Pressure (torr) | 5 | 5 |
| Showerhead to Wafer Spacing (mils) | 450 | 450 |
| High Freq. RF Power (watts) | 500 | 500 |
| Low Freq. RF Power (watts) | 150 | 150 |
| OMCTS Flow Rate (mgm) | 500 | 2500 |
| $O_2$ Flow Rate (sccm) | 500 | 160 |
| He Flow Rate (sccm) | 4800 | 1000 |

Bulk dielectric layers were formed on 300 mm wafers in a plasma CVD reactor using the conventional process parameters described above. The showerhead used to disperse the process gases included a 496 hole blocker plate that partitioned a gas supply inlet from the face plate. The face plate used was a standard REV 3 face plate. The deposition results are described below in Table 1-B.

TABLE 1-B

Deposition Conditions for Conventional Dielectric Layer Deposition

| Deposition Condition | Comparative Wafer #1 | Comparative Wafer #2 |
|---|---|---|
| Deposition Rate (Å/min) | 7077 | 7029 |
| Range | 157 | 181.35 |
| Uniformity (1 s) | 0.83% | 1.10% |
| RI | 1.4557 | 1.4542 |
| Infilm adders (<0.16 μm) | 14,900 | 32,300 |

As Table 1-B shows, for both comparative wafers measured, the infirm adders exceeding 0.16 μm in size where greater than 10,000. The majority of the adders were concentrated at or near the centers of the wafers (e.g., within 100 mm of the wafer center) and almost no adders were counted near the wafers periphery.

Experimental runs were then conducted for forming a graded dielectric layer with a 1-step intermediate OMCTS flow rate according to an embodiment of the present invention. Table 2-A lists some of the process conditions used during the deposition:

TABLE 2-A

Process Conditions for Graded Dielectric Deposition:

| Process Parameter | Initiation | Intermediate | Deposition |
|---|---|---|---|
| Time Period (sec) | 1.5 | 1 | 42 |
| Heater Temp (° C.) | 350 | 350 | 350 |
| Pressure (torr) | 5 | 5 | 5 |
| Showerhead to Wafer Spacing (mils) | 450 | 450 | 450 |
| High Freq. RF Power (watts) | 500 | 500 | 500 |
| Low Freq. RF Power (watts) | 150 | 500 | 150 |
| OMCTS Flow Rate (mgm) | 500 | 1500 | 2500 |
| $O_2$ Flow Rate (sccm) | 500 | 160 | 160 |
| He Flow Rate (sccm) | 4800 | 1000 | 1000 |

Similar to the comparative example above, bulk dielectric layers were formed on 300 mm wafers in a plasma CVD reactor using the process parameters described in Table 2-A. The same showerhead was also used. Deposition results are described in Table 2-B.

TABLE 2-B

Deposition Conditions for Graded Dielectric Layer Deposition

| Deposition Condition | Wafer #1 | Wafer #2 |
|---|---|---|
| Deposition Rate (Å/min) | 6932 | 6887 |
| Range | 186 | 204 |
| Uniformity (1 s) | 1.03% | 1.22% |
| RI | 1.4559 | 1.4546 |
| Infilm adders (<0.16 μm) | 8 | 4 |

As Table 2-B shows, the wafers having graded dielectric layers formed according to methods of the present invention had barely detectable numbers of infilm adders exceeding 0.16 μm in size (i.e., less than 10 adders). Similarly low numbers of infilm adders (9 and 16 adders) were counted for a method that included three intermediate flow rate steps between the initial and final flow rates for the OMCTS component.

Having described several embodiments, it will be recognized by those of skill in the art that various modifications, alternative constructions, and equivalents may be used without departing from the spirit of the invention. Additionally, a number of well known processes and elements have not been described in order to avoid unnecessarily obscuring the present invention. Accordingly, the above description should not be taken as limiting the scope of the invention.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps or groups.

What is claimed is:

1. A system for forming a graded dielectric layer on an underlying layer, the system comprising:
   a showerhead comprising a blocking plate and a faceplate, wherein the showerhead is coupled to a gas supply inlet through which a process gas comprising a silicon-carbon containing gas, an oxygen containing gas and a carrier gas is introduced into the showerhead;
   a liquid flow meter to control a flow rate of the silicon-carbon containing gas to the showerhead;
   a mass flow controller to control the flow rate of the carrier gas; and
   a controller comprising:
      a memory storing information indicative of instructions that when performed result in operations comprising:
         flowing the silicon-carbon containing gas at an initial flow rate during the formation of an oxygen rich portion of the graded dielectric layer, then increasing the silicon-carbon containing gas flow rate from the initial flow rate to an intermediate flow rate, and maintaining the intermediate flow rate for about 0.5 seconds or longer, and then further increasing the silicon-carbon containing gas flow rate from the intermediate flow rate to a fastest flow rate to form a carbon rich portion of the graded dielectric layer, wherein the carrier gas has a carrier gas flow rate that stays constant until after the silicon-carbon containing gas reaches the fastest flow rate.

2. The system of claim 1, wherein the silicon-carbon containing gas is a liquid at room temperature.

3. The system of claim 1, wherein the silicon-carbon containing gas comprises octamethylcyclotetrasiloxane (OMCTS).

4. The system of claim 1, wherein the oxygen containing gas comprises oxygen ($O_2$).

5. The system of claim 1, wherein the carrier gas comprises helium (He).

6. The system of claim 1, wherein the operations further comprise increasing the flow of the silicon-carbon containing gas from the initial flow rate to the first intermediate flow rate at about 600 milligrams/sec or less.

7. The system of claim 1, wherein the operations further comprise flowing the silicon-carbon containing gas at a second intermediate flow rate for about 0.5 second or longer, wherein the second intermediate flow rate is higher than the first intermediate flow rate.

8. The system of claim 1, wherein the operations further comprise decreasing the flow of the oxygen containing gas when the silicon-carbon containing gas goes from the initial flow rate to the first intermediate flow rate.

9. The system of claim 1, wherein the operations further comprise decreasing the carrier gas flow rate by about 50% or more after the silicon-carbon containing gas reaches the fastest flow rate.

10. The system of claim 1, wherein the initial flow rate of the silicon-containing gas is about 500 mgm and the fastest flow rate is about 3000 mgm.

11. The system of claim 1, wherein the operations further comprise decreasing the carrier gas flow rate from about 5000 sccm to about 1000 sccm after the silicon-carbon containing gas reaches the fastest flow rate.

12. The system of claim 1, wherein the system comprises a plasma generation system configured to form a plasma from the process gas exiting the showerhead.

13. The system of claim 12, wherein the system comprises a plasma enhanced chemical vapor deposition system.

* * * * *